(12) United States Patent
Findeklee et al.

(10) Patent No.: US 12,292,490 B2
(45) Date of Patent: May 6, 2025

(54) RADIO FREQUENCY RECEIVER WITH DETECTION OF A MALFUNCTION OF A DETUNE CIRCUIT

(71) Applicant: KONINKLIJKE PHILIPS N.V., Eindhoven (NL)

(72) Inventors: Christian Findeklee, Norderstedt (DE); Christopher Günther Leussler, Hamburg (DE); Peter Caesar Mazurkewitz, Hamburg (DE); Peter Vernickel, Hamburg (DE); Ingo Schmale, Hamburg (DE); Oliver Lips, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 61 days.

(21) Appl. No.: 18/035,963

(22) PCT Filed: Nov. 12, 2021

(86) PCT No.: PCT/EP2021/081458
§ 371 (c)(1),
(2) Date: May 9, 2023

(87) PCT Pub. No.: WO2022/101376
PCT Pub. Date: May 19, 2022

(65) Prior Publication Data
US 2023/0408608 A1     Dec. 21, 2023

(30) Foreign Application Priority Data
Nov. 12, 2020 (EP) ................................. 20207176

(51) Int. Cl.
*G01R 33/36*      (2006.01)
*G01R 33/28*      (2006.01)

(52) U.S. Cl.
CPC ....... *G01R 33/3628* (2013.01); *G01R 33/288* (2013.01)

(58) Field of Classification Search
None
See application file for complete search history.

(56) References Cited

U.S. PATENT DOCUMENTS

2002/0080911 A1    6/2002    Friedrich et al.
2010/0277175 A1   11/2010   Weiss
(Continued)

FOREIGN PATENT DOCUMENTS

CN     105143905 A   * 12/2015   ......... G01R 33/3621
EP      0315382 A2   * 5/1989   ......... G01R 33/3657
(Continued)

OTHER PUBLICATIONS

International Search Report and Written Opinion from PCT/EP2021/081458 mailed Jan. 28, 2022.

*Primary Examiner* — Rodney E Fuller

(57) ABSTRACT

For a radio frequency (RF) receiver system a solution for a safe operation of the radio frequency (RF) receiver system in magnetic resonance imaging shall be ensured. This is achieved by a radio frequency (RF) receiver system for use in a magnetic resonance (MR) imaging system the RF receiver system, wherein the RF receiver system comprises at least one RF receive coil with at least one detune circuit (1). The detune circuit (1) comprises at least a pair of crossed diodes (D1, D2) with an interface, wherein the interface is configured to measure an electrical current in the detune circuit (1) to determine the proper function of the PIN diodes (D1, D2) by measuring the detune direct current for a first detune voltage polarity and for a second reversed detune voltage polarity. The present invention also provides a magnetic resonance (MR) imaging system, a method for ensuring a safe radio frequency (RF) receiver system opera-
(Continued)

tion in magnetic resonance imaging, a software package for a magnetic resonance (MR) imaging system, a software package for upgrading a magnetic resonance (MR) imaging system and a computer program product.

19 Claims, 14 Drawing Sheets

(56) References Cited

U.S. PATENT DOCUMENTS

| | | |
|---|---|---|
| 2012/0306499 A1 | 12/2012 | Hamamura et al. |
| 2014/0002085 A1 | 1/2014 | Biber et al. |
| 2014/0070811 A1 | 3/2014 | Tomiha et al. |
| 2014/0139221 A1* | 5/2014 | Schwilch ........... G01R 33/3657 324/322 |
| 2014/0312902 A1 | 10/2014 | Tan et al. |
| 2015/0015262 A1 | 1/2015 | Greim |
| 2016/0025798 A1 | 1/2016 | Takagi |
| 2018/0074140 A1 | 3/2018 | Yang et al. |
| 2018/0329003 A1 | 11/2018 | Nistler et al. |
| 2019/0049534 A1 | 2/2019 | Guan |
| 2020/0191890 A1 | 6/2020 | Nistler et al. |
| 2021/0088607 A1* | 3/2021 | Leussler ............ G01R 33/5659 |
| 2021/0190890 A1 | 6/2021 | Biber et al. |

FOREIGN PATENT DOCUMENTS

| | | | | |
|---|---|---|---|---|
| EP | 3287805 B1 * | 6/2019 | ............. | A61B 5/055 |
| JP | 03231637 A | 10/1991 | | |
| JP | 2017131663 A | 8/2017 | | |

* cited by examiner

RADIO FREQUENCY RECEIVER WITH DETECTION OF A MALFUNCTION OF A DETUNE CIRCUIT

CROSS REFERENCE TO RELATED APPLICATIONS

This application is a U.S. national phase application of International Application No. PCT/EP2021/081458 filed on Nov. 12, 2021, which claims the benefit of EP Application Serial No. 20207176.7 filed on Nov. 12, 2020 and is incorporated herein by reference.

FIELD OF THE INVENTION

The invention relates to the field of magnetic resonance (MR) imaging. In particular, the invention relates to a radio frequency (RF) receiver system for providing MR information from an examination space of a MR imaging system. The invention further relates to a MR imaging system, a method for ensuring a safe radio frequency (RF) receiver system operation in magnetic resonance imaging, a software package for a magnetic resonance (MR) imaging system, a software package for upgrading a magnetic resonance (MR) imaging system and a computer program product.

BACKGROUND OF THE INVENTION

MRI receive coil arrays are widely used for decades in MRI. Patient safety is a major design goal. This means mainly that the coil needs to be transparent during transmission via a surrounding body coil. In the receive state, however, the coil is switched to a resonant state to pick up the MR signal efficiently. As transmission and reception use exactly the same frequency, it is very dangerous, when the coil remains resonant during transmission. In addition to safety limitations, the Bi-distortion during the transmit phase can lead to unwanted image artifacts.

The coil detune circuit is in almost all applications made by a tank circuit using an inductor switched in parallel to a resonance capacitor.

A special but very important failure mode is an unplugged coil, i.e. a coil that is placed on the patient but not connected to the MRI scanner. This coil is then also not controlled and still has to be save. Of cause, patient safety is the major design goal here; however, a coil should also be designed such that it is not damaged in such a case.

The state of the art describes typically two ways used to switch off in the unplugged situation.

The first way is to use a crossed PIN-diode switch. The switching element is made by a self-biasing crossed pair of diodes, which are fed via an induced current from the transmitting body coil. This method, however, can fail in case of at least one of the PIN diodes is broken and then reacts similar to an open circuit. In that case, the switch is not completely active.

The second way is to use a fuse. A simple fuse can be used in series of the coil conductor, which burns in case of too high current. This is today the preferred way of ensuring patient safety, however, it comes with significant losses and therefore with a small SNR-drop. In addition, the fuse demands additional space, which is a problem in modern flexible coil arrays. Note that current trents in RX coils aim for high channel counts and small flexible elements for which a traditional fuse reacts too slow to ensure patient safety. An additional passive detune circuit with the crossed diodes needs to be used to prevent damage of an unplugged coil such that the fuse does not burn in case of a correctly operating passive detune circuit.

The document US2002/080911 discloses a receptive coil arrangement for magnetic resonance (MR) imaging tomography systems, of the type having a number of selectively pluggable local coils, in which at least some of local coils are active detuned and also have a passive detuning circuit for the transmission phase.

The document US2018/074140 discloses a magnetic resonance imaging (MRI) radio frequency (RF) coil comprising an LC circuit including at least one series capacitor, and a decoupling circuit connected in parallel to the LC circuit. The decoupling circuit is configured to decouple the MRI RF coil from one or more other MRI RF coils using passive decoupling upon the production of an induced voltage in the decoupling circuit, or to actively decouple the MRI RF coil from one or more other MRI RF coils upon the insertion of a DC bias into the decoupling circuit. The decoupling circuit includes a pair of fast switching PIN diodes including a first PIN diode connected antiparallel with a second PIN diode, the second PIN diode connected in series with a first capacitor. The decoupling circuit further includes an inductor connected in series with the pair of fast switching PIN diodes and the capacitor.

The US-patent application US2020/151890 discloses a radio frequency coil with a detune circuit. This US-patent application US2020/151890 discloses to check the proper functioning of the detune circuit on the basis of a comparison of the response to a test RF pulse with a threshold.

SUMMARY OF THE INVENTION

It is an object of the invention to provide a radio frequency (RF) receiver system, wherein a safe operation of the radio frequency (RF) receiver system in magnetic resonance imaging is ensured.

According to the invention, this object is addressed by the subject matter of the independent claims. Preferred embodiments of the invention are described in the sub claims.

Therefore, according to the invention, a radio frequency (RF) receiver system for use in a magnetic resonance (MR) imaging system is provided, the RF receiver system comprising: at least one RF receive coil, the RF receive coil comprising at least one detune circuit, wherein the detune circuit comprising at least a pair of (at least DC-wise) crossed diodes, wherein the detune circuit further comprises an interface, wherein the interface is configured to measure an electrical current in the detune circuit to determine the proper function of the PIN diodes by measuring the detune direct current for a first detune voltage polarity and for a second reversed detune voltage polarity.

According to the invention, the detune circuit is configured to measure an electrical detune direct current in the detune circuit in order to determine the proper function of the PIN diodes, notably to detect if there is a broken PIN diode. This may be done for each individual examination or even for each individual RF pulse within each examination. Further the crossed pin-diodes render the receiver coil off-resonant when unconnected. The present invention retains the receiver coil safe when unconnected. Because the detune circuit may signal faults in the PIN diode, an additional fuse is no longer required. Moreover, as the detune circuit signals faults during operation, it is avoided that the receiver coil is used again before being repaired. In an embodiment of the invention there may be inductors in series with the diodes before connecting them antiparallely.

In another disclosed aspect, the RF receiver system comprises a controller for controlling the measurement of the detune direct current.

It is further envisioned that the controller is further configured to send a signal to the magnetic resonance (MR) imaging system in case of an incorrect function of the diodes. The signal can also be a warning signal, for example, to ensure that the coil is not being used prior a repair. For example a safety mechanism can be provided to prevent the RF receive coil from being used when the signal was send out by the controller.

In accordance with embodiments of the present system, the detune circuit comprises at least one resistor, wherein the resistor is connected in series to the PIN diodes to ensure that a certain DC current is flowing.

According to an advantageous embodiment of the invention the diodes are PIN diodes.

The present invention also provides a magnetic resonance (MR) imaging system, comprising a radio frequency (RF) receiver system as described above.

The present invention further provides a method for ensuring a safe radio frequency (RF) receiver system operation in magnetic resonance imaging, comprising an RF receiver system as described above, the method comprising the following steps:
   measuring a detune direct current for a first detune voltage polarity,
   measuring the detune direct current for a second reversed detune voltage polarity,
   assessing the proper function of the diodes from the detune direct currents measurements.

In an embodiment of the invention the method comprises the step of defining a valid window for the current level with a lower threshold and an upper threshold for defining a malfunction of the diodes.

In an embodiment of the invention the the method comprises the step of measuring the detune direct current by measuring a voltage across a resistor, wherein the resistor is connected in series to the diodes.

In a further embodiment of the invention wherein the radio frequency (RF) receiver system comprises a controller for controlling the measurement of the detune direct current, the method comprises the further step of:
   sending a signal to the magnetic resonance (MR) imaging system by the controller in case of an incorrect function of the PIN diodes to ensure that the RF receive coil is not used.

The present invention provides a software package for a magnetic resonance (MR) imaging system, whereby the software package contains instructions for controlling a radio frequency (RF) receiver system a described above.

The present invention further provides a software package for upgrading a magnetic resonance (MR) imaging system, whereby the software package contains instructions for controlling a radio frequency (RF) receiver system as described above.

The present invention also provides a computer program product comprising instructions which, when the program is executed by a computer, cause the computer to carry out the steps of the method as described above.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1A:
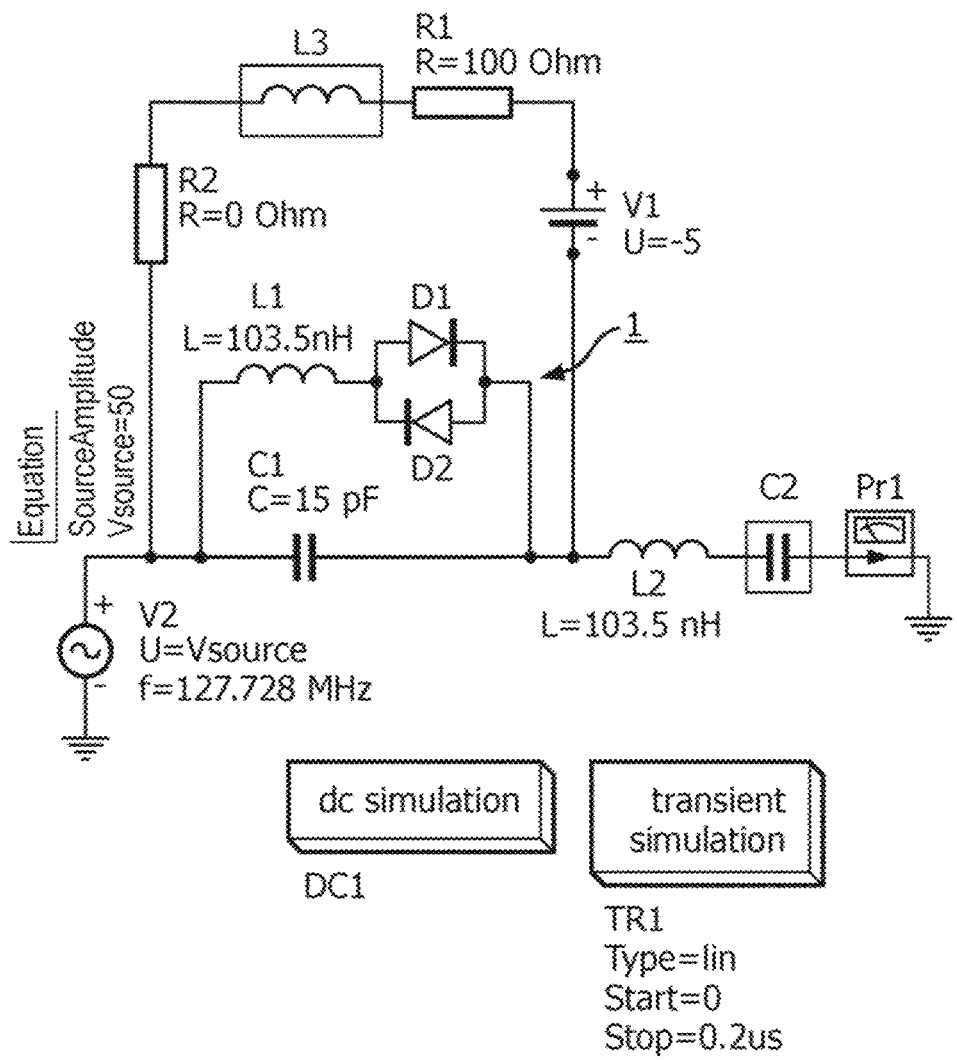
FIG. 1 a) shows a circuit diagram of a detune circuit with a crossed PIN diode switch used for an actively detuned receive coil and b) shows a simulation of the resulting current excited via body coil inductively, FIG. 2 a) shows a circuit diagram of a detune circuit with an unprotected coil by means of both failing diodes excited via body coil inductively leading to a hazardous situation for patient or device and b) shows a simulation of the resulting current, FIG. 3 a) shows a circuit diagram of a detune circuit in failure mode with a single broken PIN diode and b) shows a simulation of the resulting current, which is in this case still low since the actively switched diode is still operational, FIG. 4 a) shows an MR Sequence with RF transmit pulses, b) a detune voltage and c) the detune direct current for FIG. 1 or 2, i.e. with the switched PIN-diode operational, FIG. 5 a) shows a circuit diagram of a detune circuit with an unconnected coil (R2→∞) with a single broken PIN diode and b) shows a simulation of the resulting current, FIG. 6 a) shows a circuit diagram of a detune circuit with an unconnected coil with operational passive detune circuit and b) shows a simulation of the resulting current, FIG. 7 a) shows an MR Sequence with transmit pulses, b) a detune voltage wherein the detune voltage polarity is alternating with every RF pulse and c) a detune direct current according to an embodiment of the invention, FIG. 8 a) shows an MR Sequence with transmit pulses, b) a detune voltage with a short test detune signal in the opposite direction and c) a detune direct current according to an embodiment of the invention.
Figure 1B:
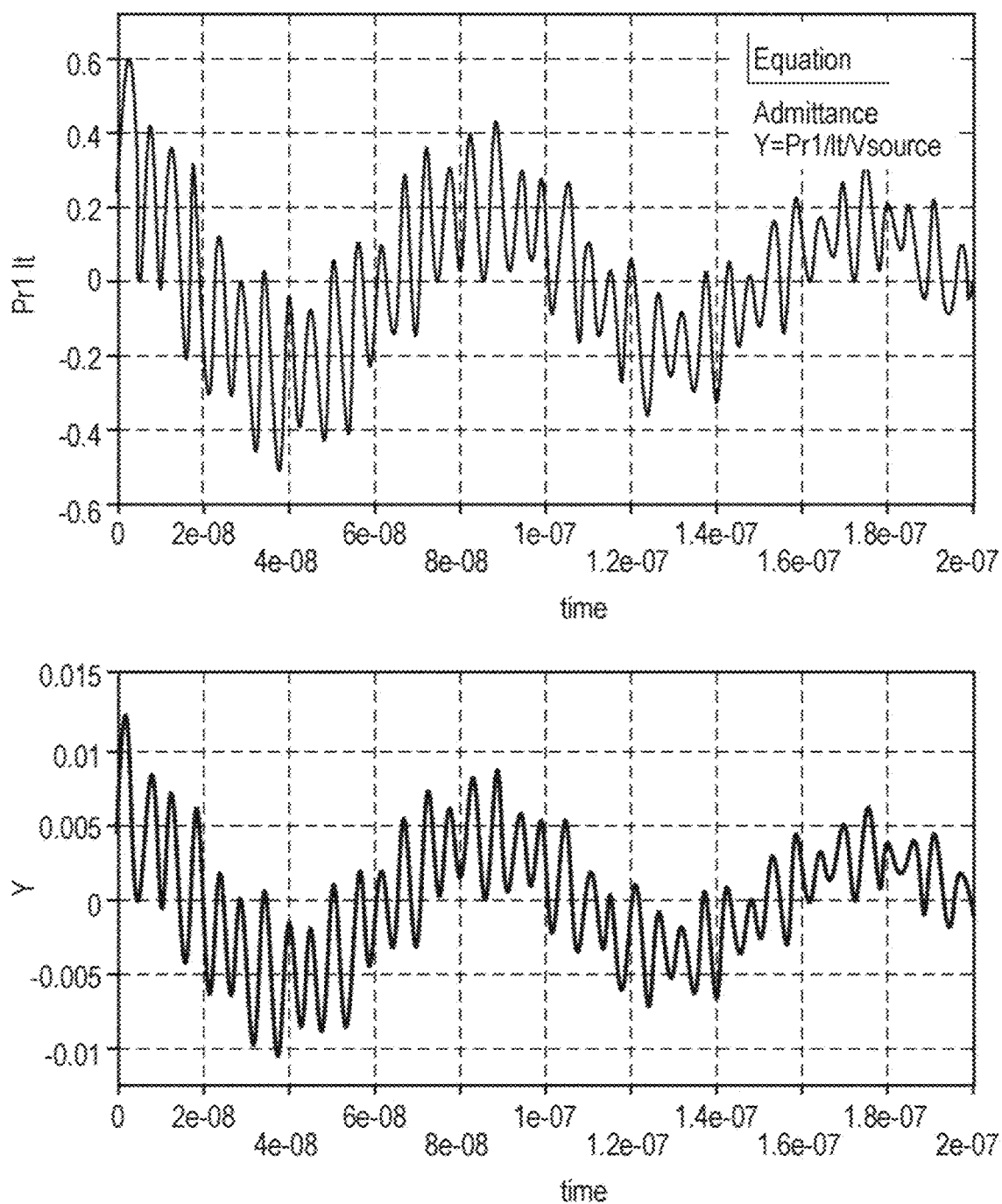

FIG. 1 a) shows a circuit diagram of a detune circuit 1 with a crossed PIN diode D1, D2 switch used for an actively detuned receive coil according to the state of the art. FIG. 1 b) illustrates the operation of the detune circuit 1 with crossed PIN diodes D1, D2 according to the state of the art. In FIG. 1 b) it can be seen when comparing with FIG. 2 that the detune circuit 1 reduces the induced current by more than a factor of 10.

Figure 2A:
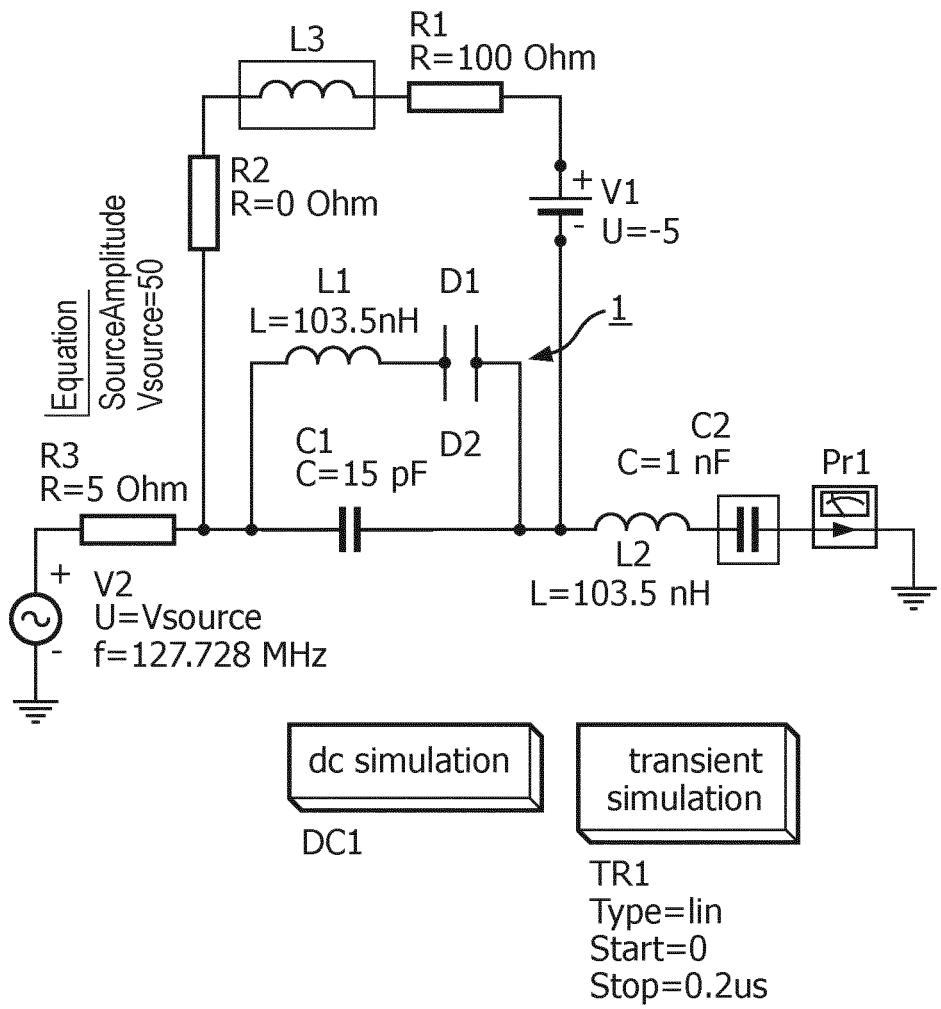
Figure 2B:
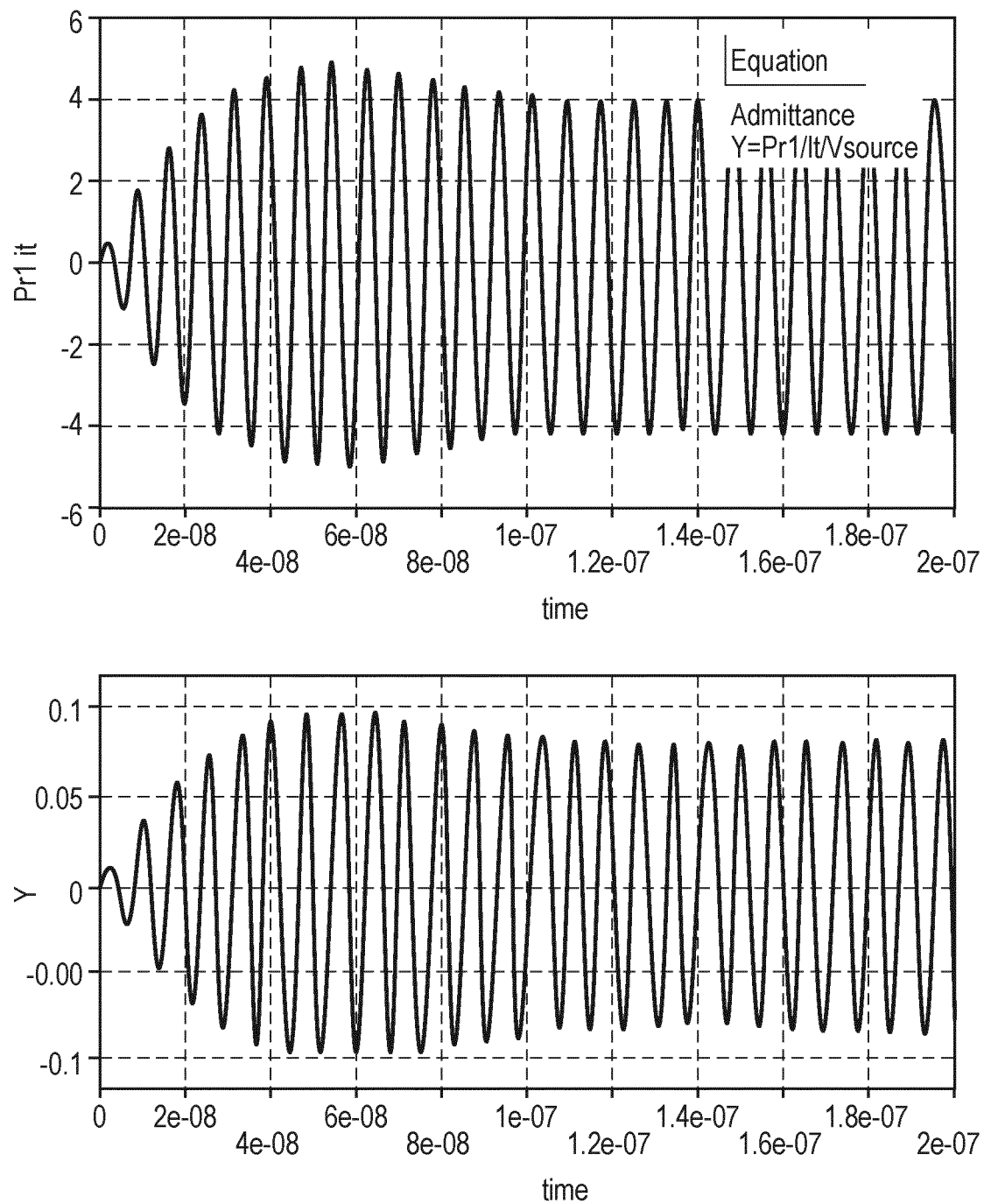

FIG. 2 a) shows almost the same circuit as shown in FIG. 1a) but with the worst-case situation that both PIN diodes D1, D2 are broken or simply disconnected. Without a fuse, the current reaches a dangerous level of here 4 A shown in FIG. 2 b).

Figure 3A:
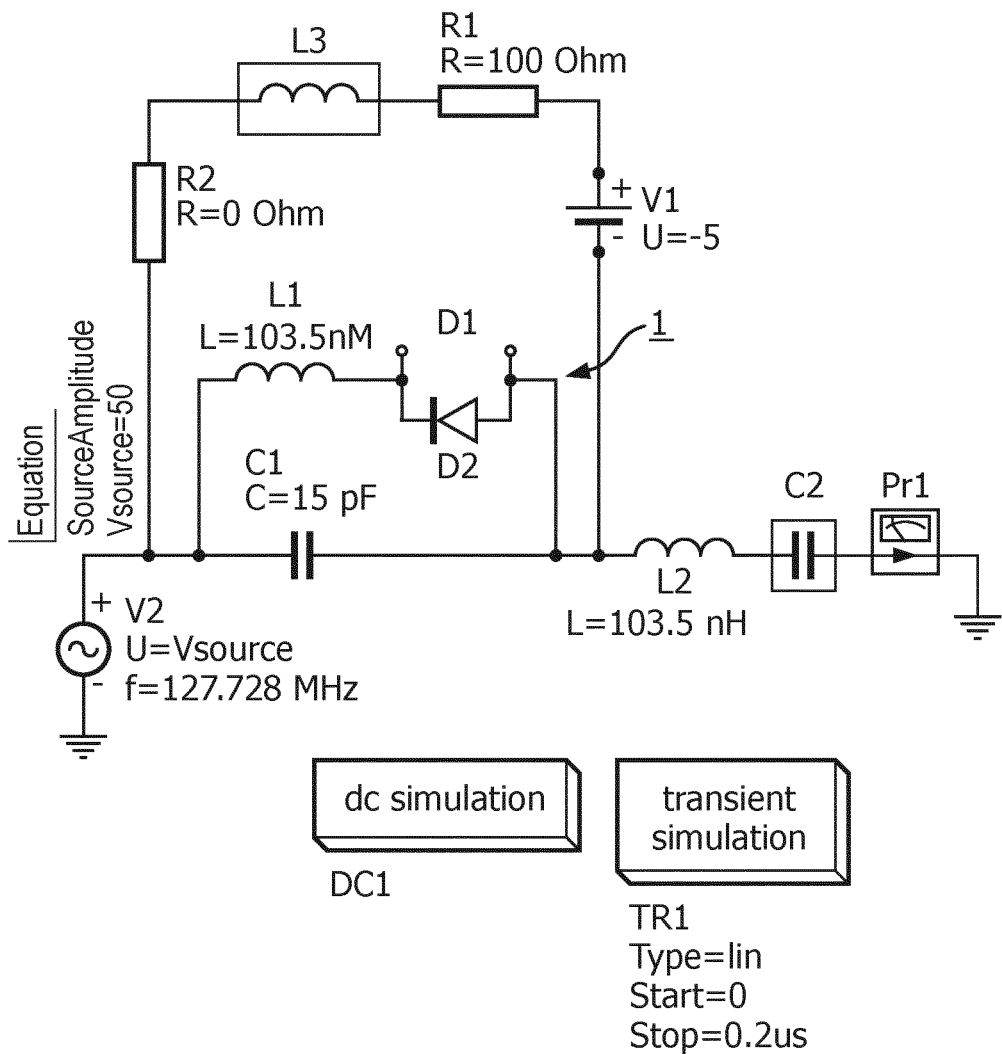
Figure 3B:
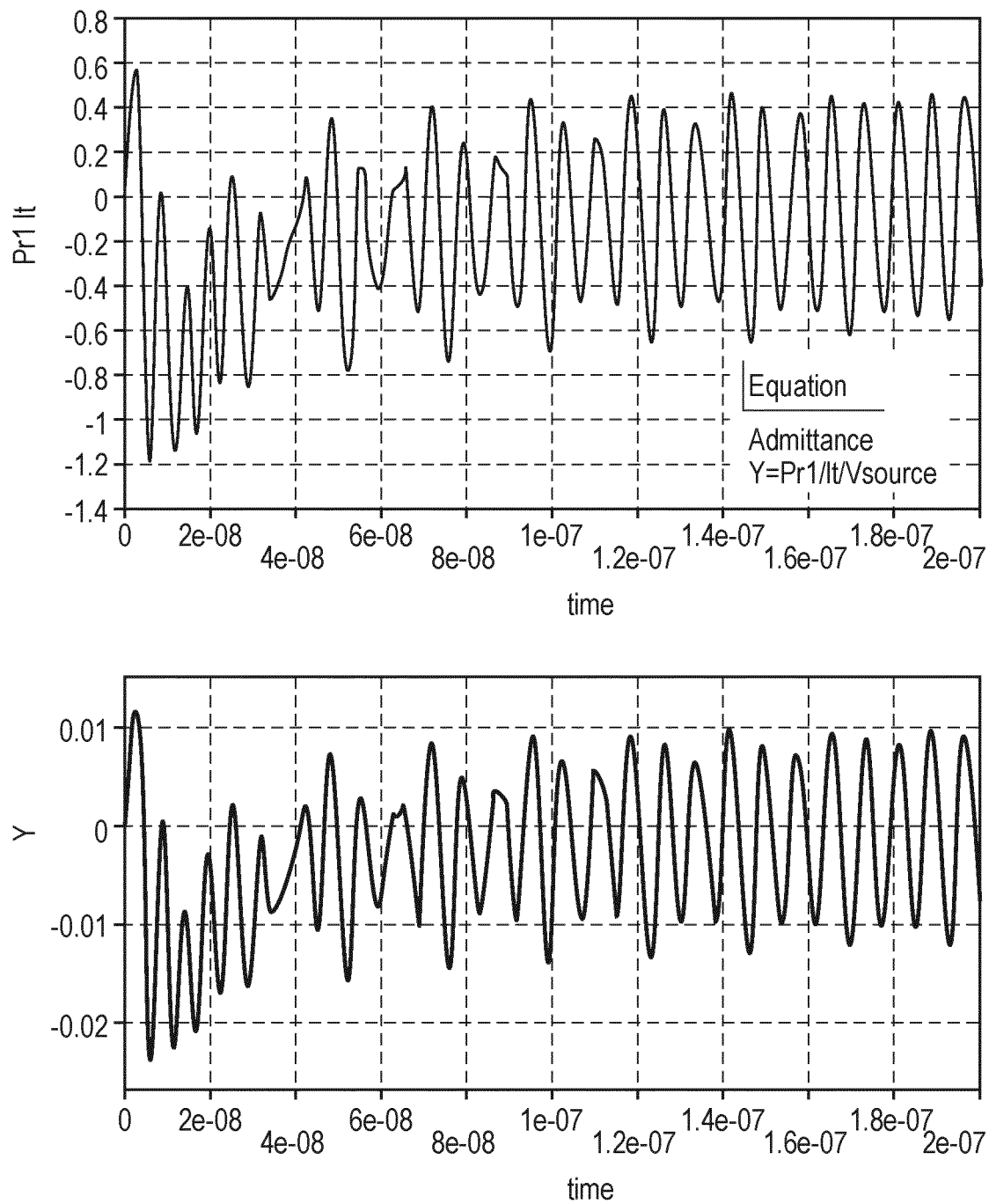

FIG. 3 a) shows a failure mode with a single broken PIN diode D1 which would not be detected in the current coils. In that simulation, the remaining PIN diode D2 is powered and therefore still detunes the coil as it can be seen in FIG. 3 b).

Figure 4A:
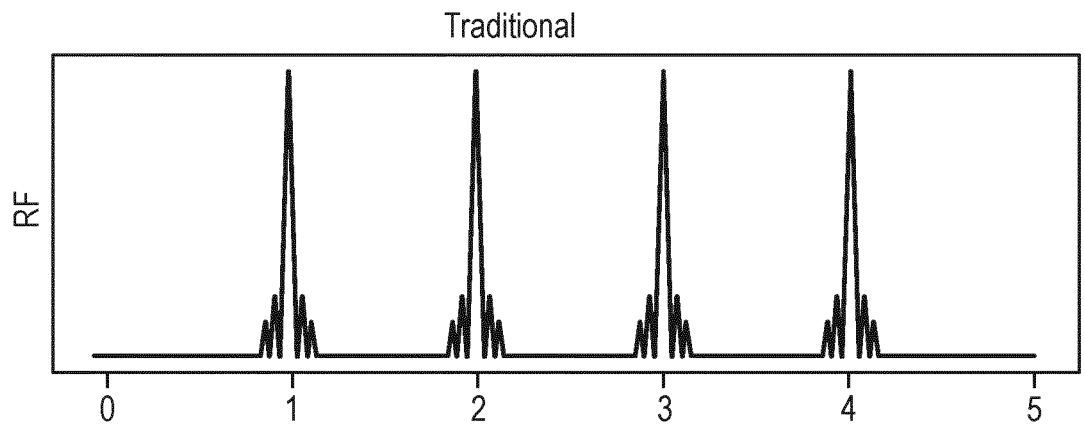
Figure 4B:
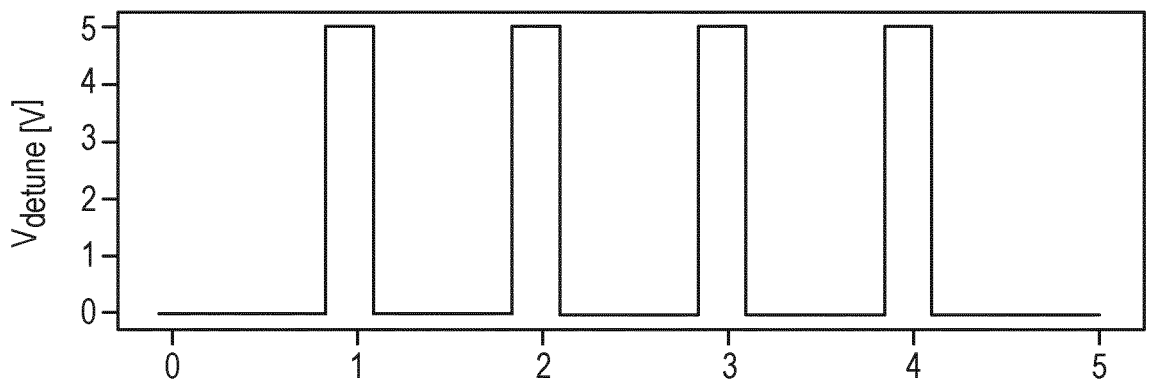
Figure 4C:
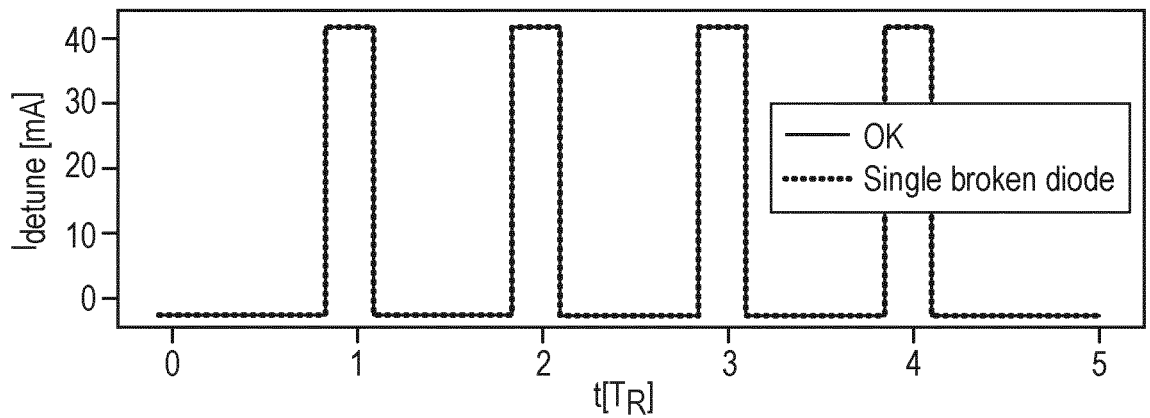

In FIG. 4 a) a MR Sequence with transmit pulses is shown. The detune voltage is shown in FIG. 4 b). FIG. 4 c) shows the detune direct current for the MR sequence, where the solid line shows the detune direct current of a working detune circuit 1 and the dotted line shows the detune direct current with one of the PIN diodes, in particular D2, which is not forward biased for detuning the coil, broken. By the same course of the two lines you can see that this particular failure mode with just single broken PIN diode D1 cannot be detected, at least for that PIN diode D1 which is not conducting in the active detune state.

Figure 5A:
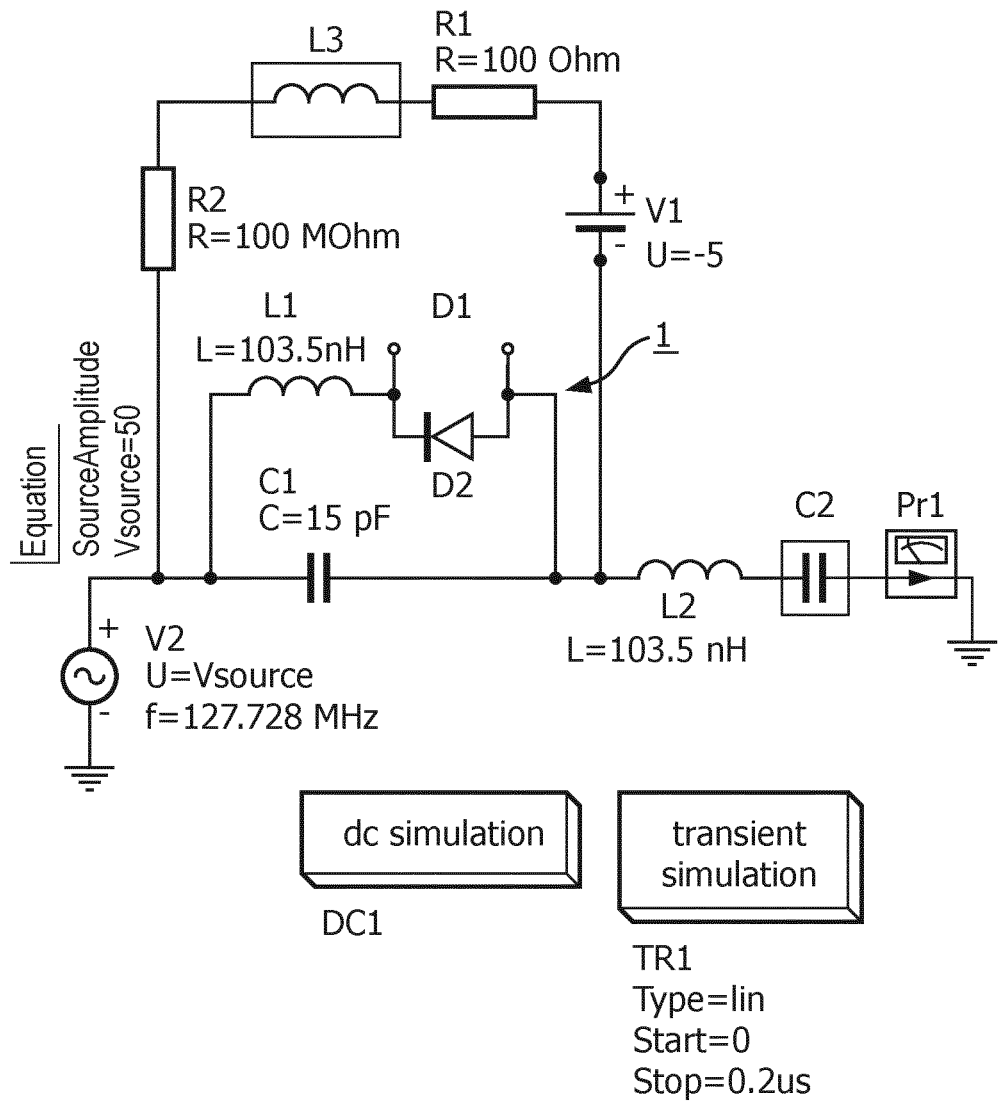
Figure 5B:
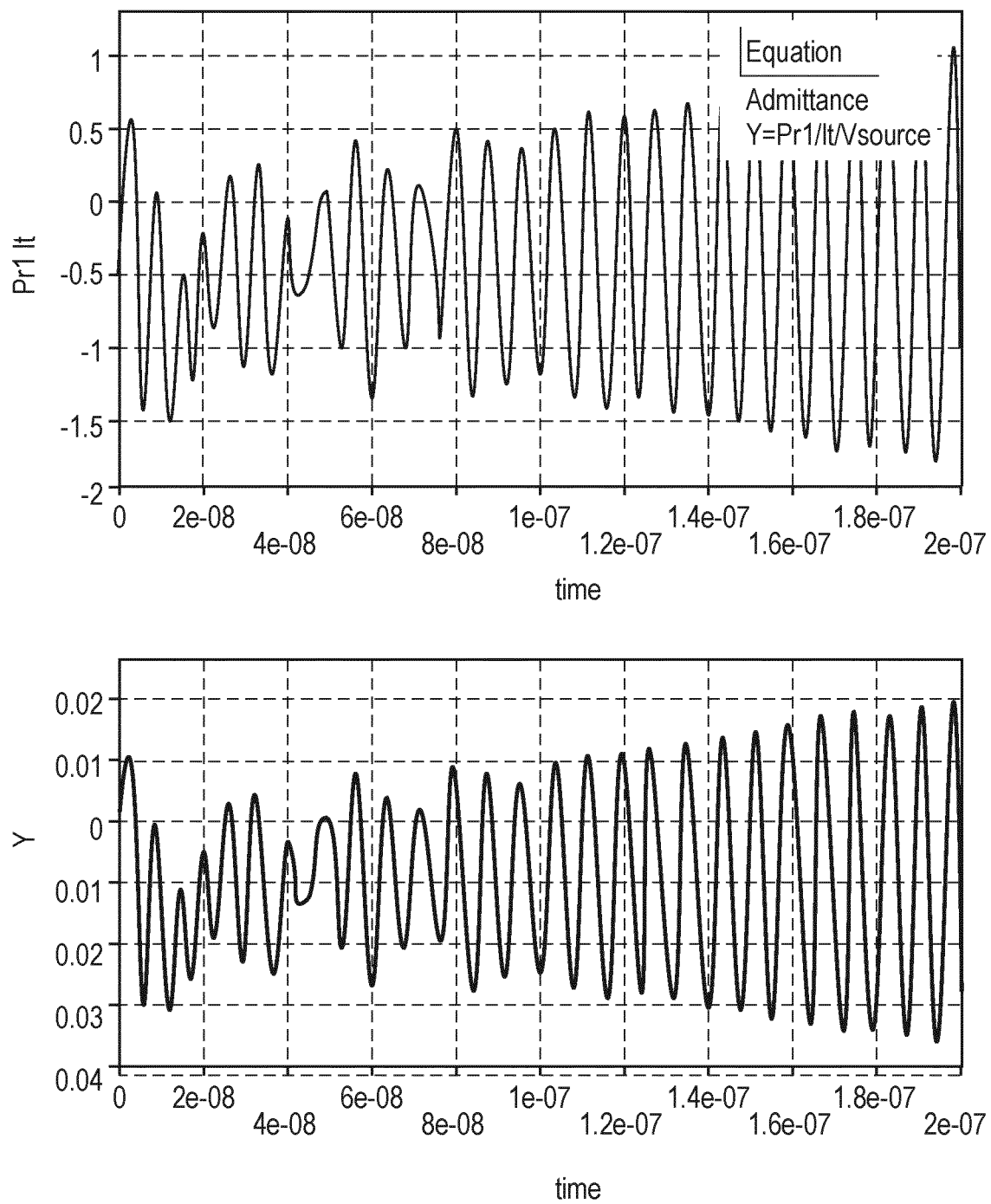

FIG. 5 a) shows a circuit diagram of a detune circuit 1 with an unconnected coil with a single broken PIN diode D1. FIG. 5 b) shows a simulation of the corresponding resulting current. FIG. 5 shows the dangerous situation that the coil is unconnected, simulated by the resistor R2 with 100 MOhm. For this situation, a fuse is implemented in the state of the art.

Figure 6A:
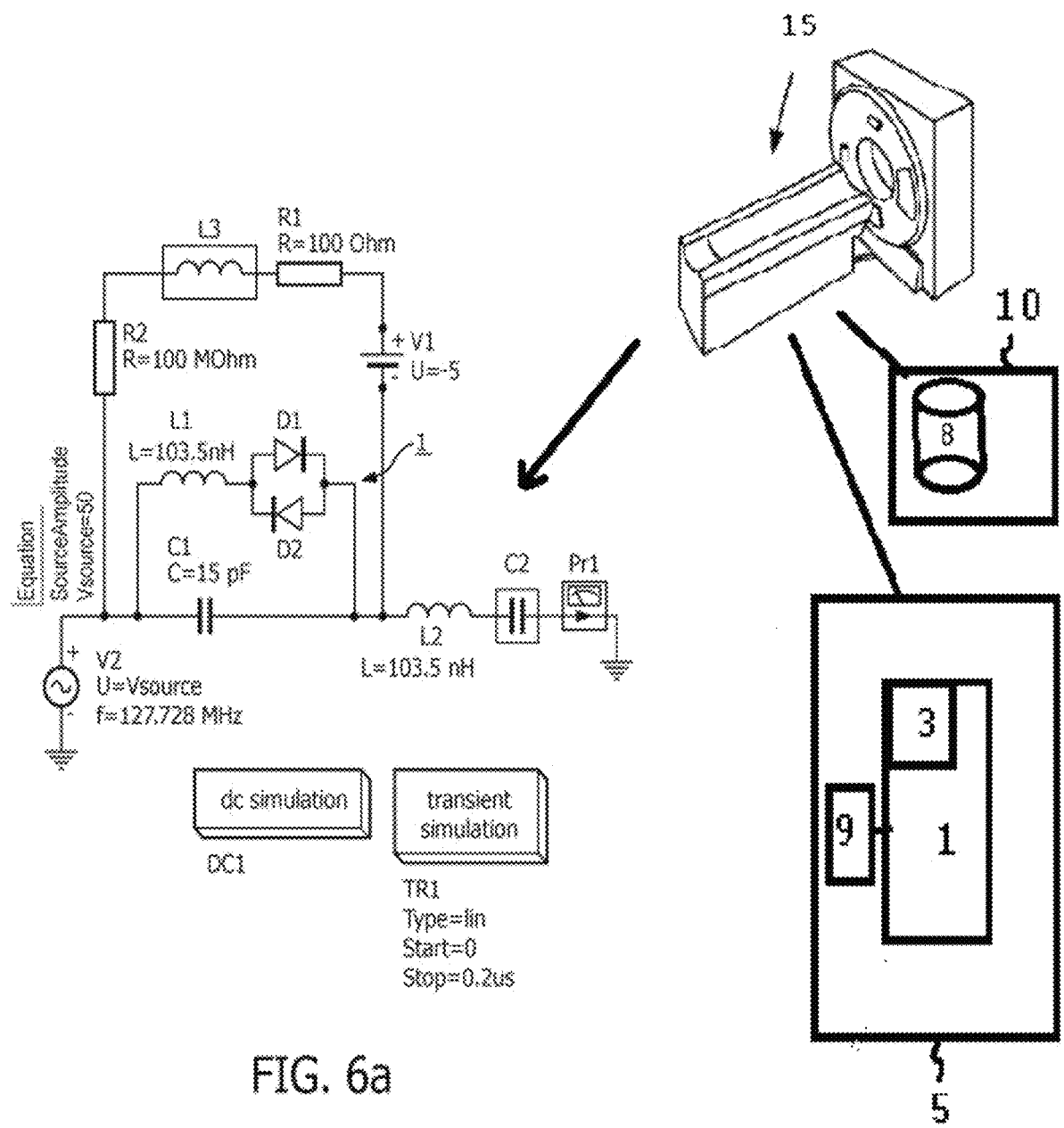
Figure 6B:
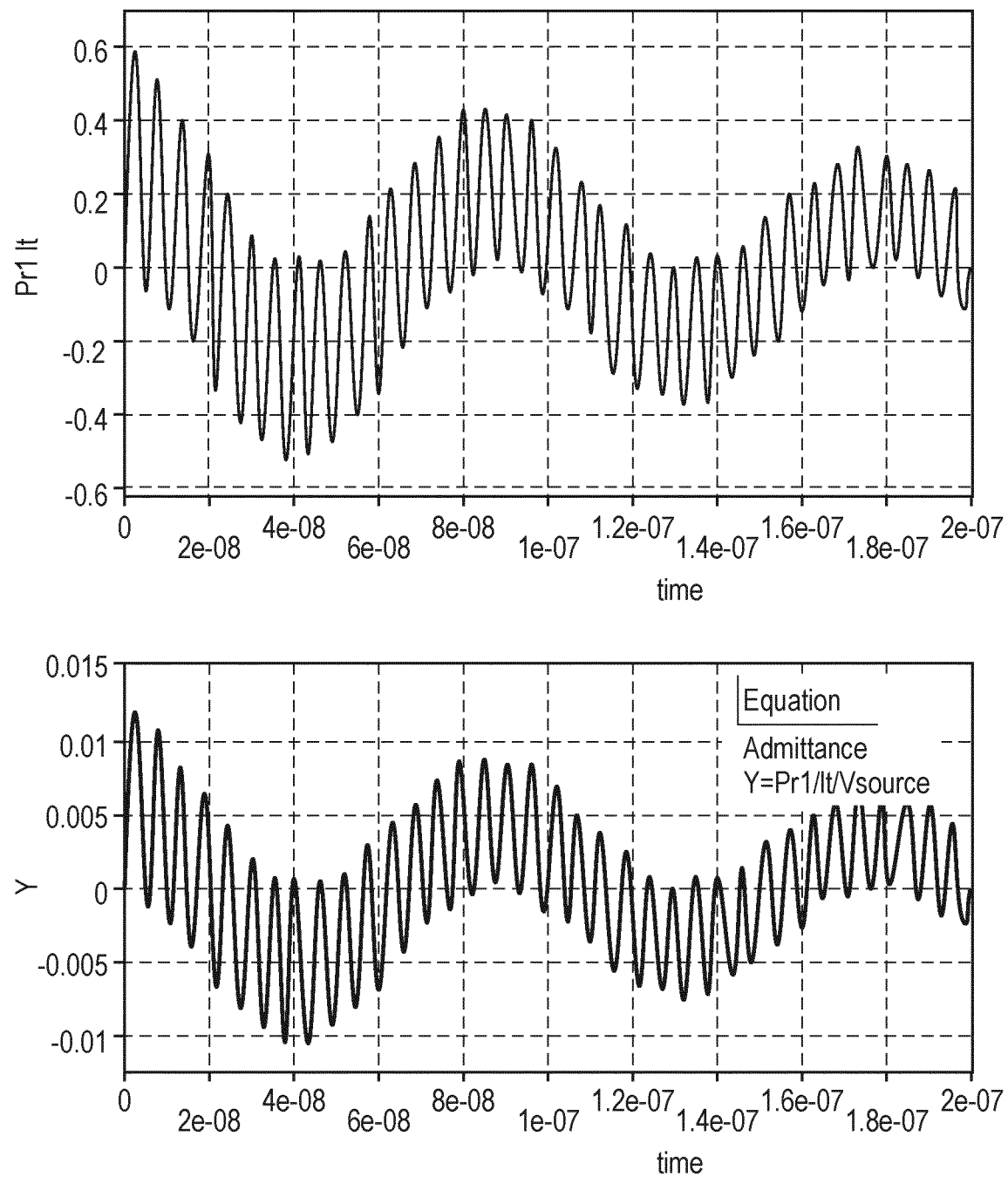

FIG. 6a shows a magnetic resonance (MR) imaging system 15 which comprises (or is in connection with) a computer 10 and a non-transitory computer readable medium 8 and a RF receive coil 5 having a passive detune circuit 1 connected to a controller 9. The detune circuit 1 comprises an interface 3 as described further below. If the passive detune circuit 1 of RF receive coil 5 would be operational as sketched in FIG. 6, the current can be reduced to a safe level. The invention proposes to use crossed PIN diodes D1, D2 as detune circuit 1 alone, without a fuse, but with an improved interface 3, which detects any broken PIN diode D1, D2 in both directions by measuring the detune direct current also for a reversed detune voltage polarity.

Figure 7A:
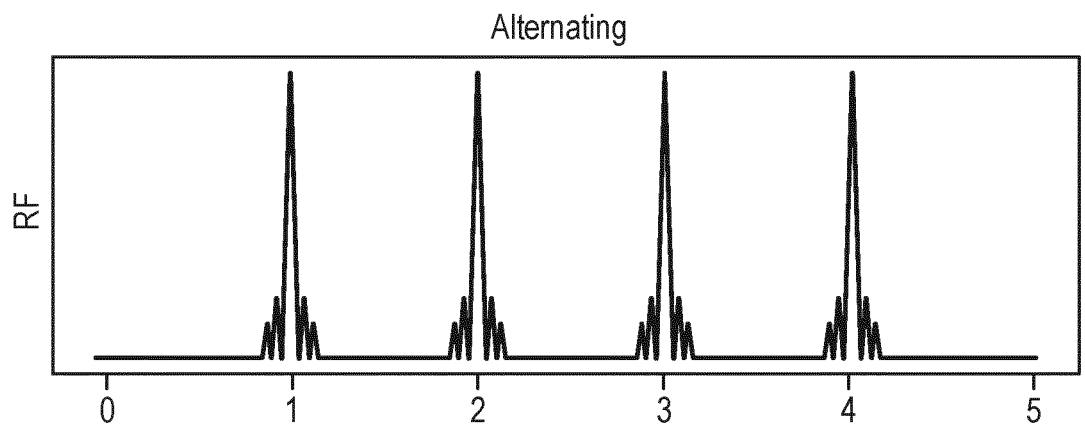
Figure 7B:
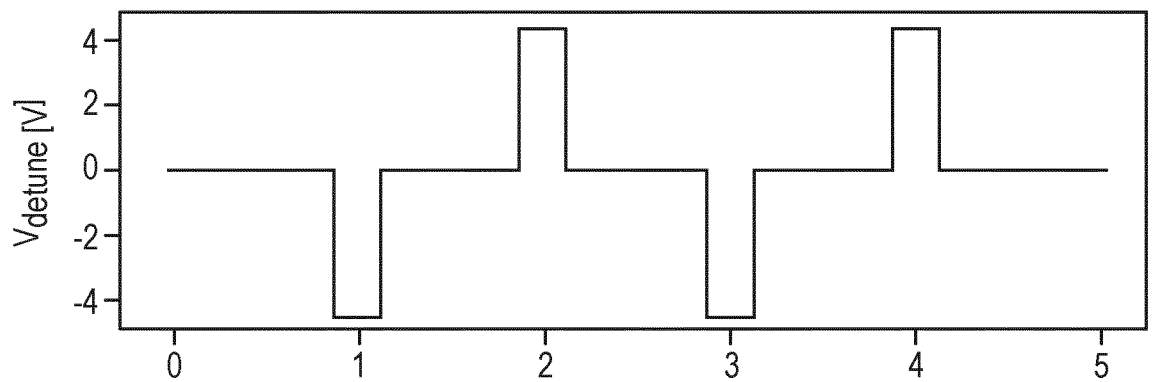
Figure 7C:
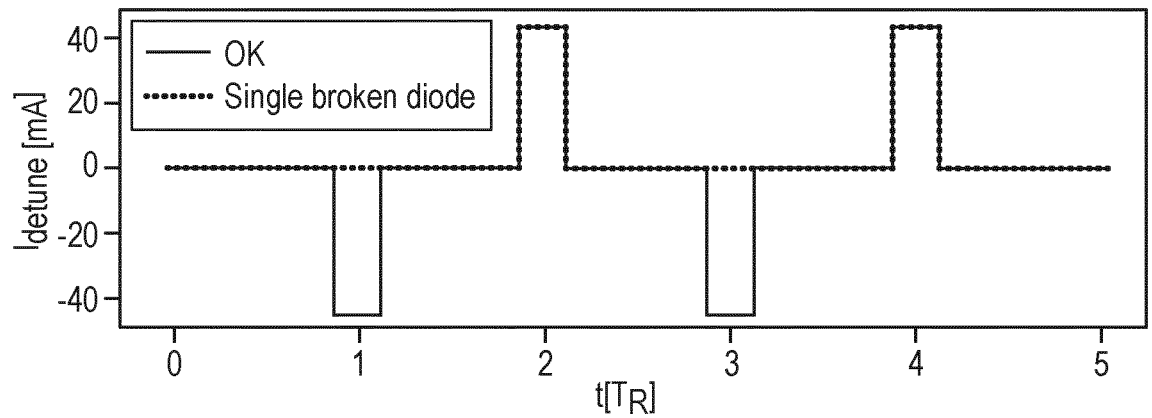

In an embodiment of the invention, the detune direct current direction is alternated with every RF-pulse as it is sketched in FIG. 7. FIG. 7 a) shows an MR Sequence with transmit pulses, b) a detune voltage wherein the detune voltage polarity is alternating with every RF pulse and c) the detune direct current according to an embodiment of the invention. The solid line in c) shows the detune direct current of a working detune circuit 1 and the dotted line shows the detune direct current with one of the PIN diodes D1, D2 broken. Because the two lines do not describe the same course, a faulty PIN diode can be detected. In the case shown in FIG. 7 a broken PIN diode D1, D2 is detected before having a dangerous constellation. The operation of both PIN diodes D1, D2 is ensured each time the coil is plugged into the scanner. It is very unlikely that a broken PIN diode D1, D2 is not detected before using the coil in a potentially unsafe situation. Each single failure (unconnected coil or broken PIN diode D1, D2) then is still safe.

Figure 8A:
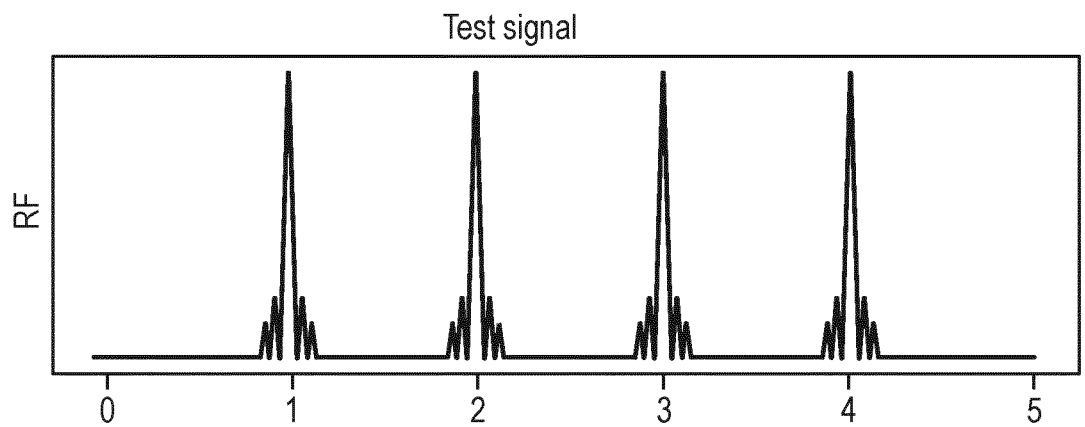
Figure 8B:
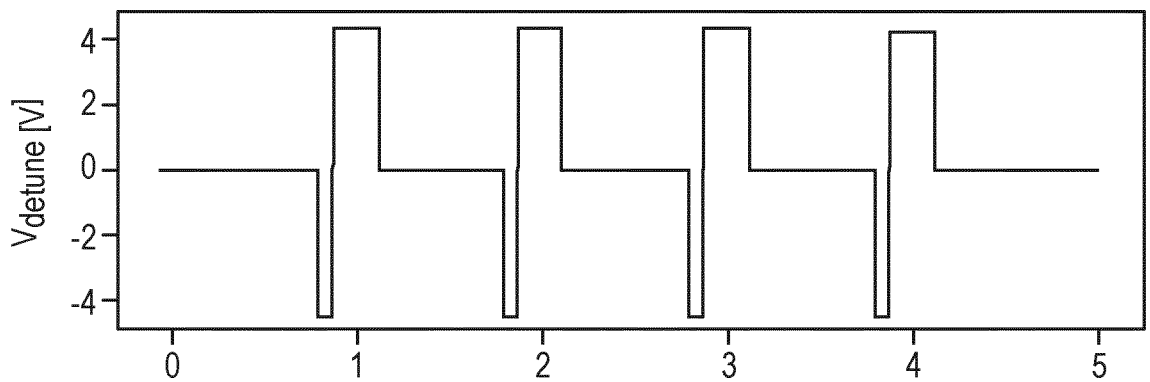
Figure 8C:
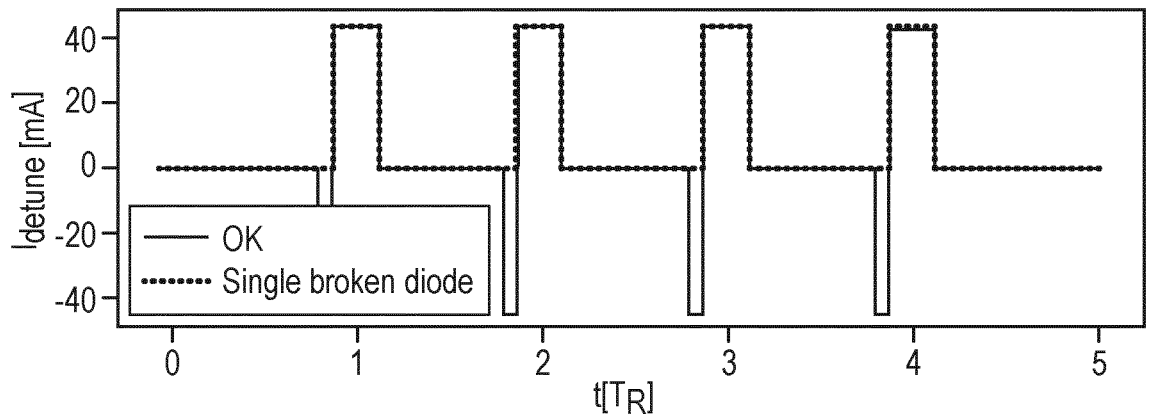

FIG. 8 a) shows an MR Sequence with transmit pulses, b) shows a detune voltage wherein the detune voltage polarity is alternating with every RF pulse, in c) the detune direct current with a short pre-pulse detune current just to detect a broken PIN diode D1, D2 in both directions according to another embodiment of the invention is shown. The solid line in c) shows the detune current of a working detune circuit 1 and the dotted line shows the detune current with one of the PIN diodes D1, D2 broken. Already by using a short short pre-pulse detune current the two curves show a different course and a faulty PIN diode D1, D2 can be detected. In an embodiment of the invention, the reversed current can also be applied after the receive period.

Figure 9:
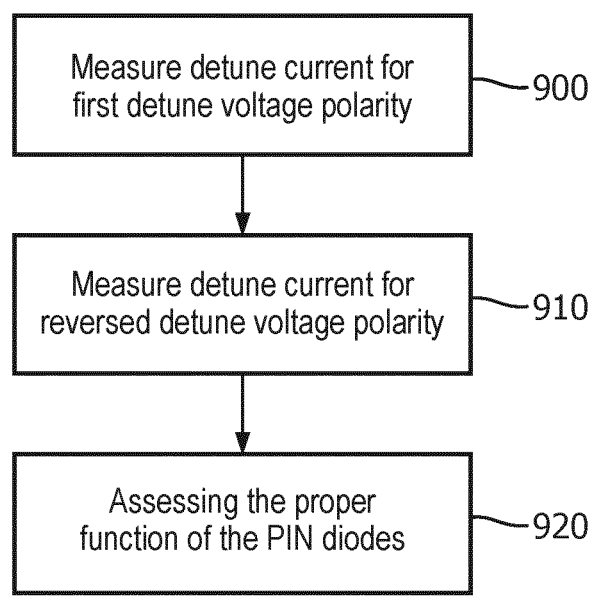
FIG. 9 shows a flowchart of a method for ensuring a safe radio frequency (RF) receiver system operation in magnetic resonance imaging in accordance with an embodiment of the invention.

In FIG. 9 a flowchart of a method for ensuring a safe radio frequency (RF) receiver system operation in magnetic resonance imaging in accordance with an embodiment of the invention is shown. For the method, a radio frequency (RF) receiver system as described above is used, whereby in particular an interface 3 of the RF receiver system is configured to measure an electrical current in the detune circuit 1 to determine the proper function of the PIN diodes D1, D2 by measuring the detune direct current for a first detune voltage polarity and for a second reversed detune voltage polarity.

The method starts with step 900 by measuring a detune direct current for a first detune voltage polarity.

In step 910 a detune direct current for a second reversed detune voltage polarity is measured. In an embodiment of the invention the detune direct current is alternated by alternating the detune voltage polarity with every RF-pulse. The detune direct current can for example be measured by measuring a voltage across a resistor R1, wherein the resistor is connected in series to the PIN diodes. This ensures that a certain DC current is flowing. In an embodiment of the invention the detune direct current is alternated by alternating the detune voltage polarity with every RF-pulse.

In step 920 the proper function of the PIN diodes from the detune direct currents measurements is assessed. In addition, the RF receiver system can have a controller 9 that controls the current measurements and can be set up to send a signal to the magnetic resonance (MR) imaging system 15 in the event of a malfunctioning detune circuit, for example due to a faulty PIN diode. The signal can also be a warning signal, for example, to ensure that the coil is not being used prior a repair. For example a safety mechanism can be provided to prevent the RF receive coil from being used when the signal was send out by the controller 9.

In an embodiment of the invention a resistor is connected in series to the PIN diodes to ensure that a certain DC current is flowing for each polarity of the detune voltage. By measuring the voltage across the resistor, the DC current can be determined.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST detune circuit 1
PIN diode D1
PIN diode D2
resistor (for defining the detune direct current) R1
resistor (for simulating unconnected coil) R2

The invention claimed is:

1. A radio frequency (RF) receiver system for use in a magnetic resonance (MR) imaging system, the RF receiver system comprising:
   at least one RF receive coil, the RF receive coil comprising at least one detune circuit, wherein the detune circuit comprising at least a pair of crossed diodes (D1, D2),
   wherein the detune circuit further comprises an interface, wherein the interface is configured to measure an electrical direct current in the detune circuit to determine the proper function of the diodes (D1, D2) by measuring the detune direct current for a first detune voltage polarity and for a second reversed detune voltage polarity.

2. The radio frequency (RF) receiver system according to claim 1, wherein the RF receiver system comprises a controller for controlling the measurement of the detune direct current by the interface of the detune circuit.

3. The radio frequency (RF) receiver system according to claim 2, wherein the controller is further configured to send a signal to the magnetic resonance (MR) imaging system in case of an incorrect function of the diodes (D1, D2).

4. The radio frequency (RF) receiver system according to claim 1, wherein the detune circuit comprises at least one resistor (R1), wherein the resistor (R1) is connected in series to the diodes (D1, D2) to ensure that a certain DC current is flowing.

5. The radio frequency (RF) receiver system according to claim 1, wherein the diodes (D1, D2) are PIN diodes.

6. A magnetic resonance (MR) imaging system, comprising a radio frequency (RF) receiver system as claimed in claim 1.

7. A method for ensuring a safe radio frequency (RF) receiver system operation in magnetic resonance imaging, comprising an RF receiver system as claimed in claim 1, the method comprising:
measuring, with the interface of the detune circuit, a detune direct current for a first detune voltage polarity,
measuring, with the interface of the detune circuit, the detune direct current for a second reversed detune voltage polarity,
assessing the proper function of the diodes (D1, D2) from the detune direct currents measurements.

8. The method according to claim 7, wherein the method comprises the step of defining a valid window for the current level with a lower threshold and an upper threshold for defining a malfunction of the diodes.

9. The method according to claim 8, wherein the method comprises the step of measuring the detune direct current by measuring a voltage across a resistor (R1), wherein the resistor (R1) is connected in series to the diodes (D1, D2).

10. The method according to claim 9, wherein the measurement of the detune direct current is alternated by alternating the detune voltage polarity with every RF-pulse with an individual examination.

11. The method according to claim 8, wherein the radio frequency (RF) receiver system comprises a controller for controlling the measurement of the detune direct current, the method comprises the further step of:
sending a signal to the magnetic resonance (MR) imaging system by the controller in case of an incorrect function of the diodes (D1, D2) to ensure that the RF receive coil is not used.

12. A software package for a magnetic resonance (MR) imaging system, wherein the software package contains instructions stored on a non-transitory computer readable medium for controlling a radio frequency (RF) receiver system according to the method of claim 7.

13. A software package for upgrading a magnetic resonance (MR) imaging system, wherein the software package contains instructions stored on a non-transitory computer readable medium for controlling a radio frequency (RF) receiver system according to the method of claim 7.

14. A computer program product comprising instructions stored on a non-transitory computer readable medium which, when the program is executed by a computer, cause the computer to carry out a method for ensuring a safe radio frequency (RF) receiver system operation in magnetic resonance imaging, comprising an RF receiver system for use in a magnetic resonance (MR) imaging system, the RF receiver system comprising at least one RF receive coil, the RF receive coil comprising at least one detune circuit, wherein the detune circuit comprises at least a pair of crossed diodes (D1, D2), wherein the method comprises:
measuring a detune direct current for a first detune voltage polarity,
measuring the detune direct current for a second reversed detune voltage polarity, and
assessing the proper function of the diodes (D1, D2) from the detune direct currents measurements,
wherein the radio frequency (RF) receiver system comprises a controller for controlling the measuring of the detune direct current.

15. The computer program product of claim 14, wherein measuring the detune current is performed by an interface of the detune circuit.

16. The computer program product of claim 14, wherein the method comprises the step of defining a valid window for the current level with a lower threshold and an upper threshold for defining a malfunction of the diodes.

17. The computer program product of claim 14, wherein the method comprises the step of measuring the detune direct current by measuring a voltage across a resistor (R1), wherein the resistor (R1) is connected in series to the diodes (D1, D2).

18. The computer program product of claim 14, wherein the measurement of the detune direct current is alternated by alternating the detune voltage polarity with every RF-pulse within every individual examination.

19. The computer program product of claim 14, wherein the method comprises the further step of:
sending a signal to the magnetic resonance (MR) imaging system by the controller in case of an incorrect function of the diodes (D1, D2) to ensure that the RF receive coil is not used.

* * * * *